(12) United States Patent
Nishida

(10) Patent No.: US 7,419,914 B2
(45) Date of Patent: Sep. 2, 2008

(54) SEMICONDUCTOR DEVICE FABRICATION METHOD

(75) Inventor: Naoki Nishida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 30 days.

(21) Appl. No.: 11/357,139

(22) Filed: Feb. 21, 2006

(65) Prior Publication Data

US 2007/0093062 A1    Apr. 26, 2007

(30) Foreign Application Priority Data

Oct. 24, 2005    (JP) .............................. 2005-308621

(51) Int. Cl.
*H01L 21/302* (2006.01)
(52) U.S. Cl. ..................... 438/725; 438/704; 438/705; 438/714; 438/734; 438/749; 134/1.2; 134/1.3
(58) Field of Classification Search ............... 134/1.2, 134/1.3; 438/704, 705, 714, 725, 734, 749
See application file for complete search history.

(56) References Cited

U.S. PATENT DOCUMENTS 6,130,167 A * 10/2000 Tao et al. .................. 438/710
6,133,143 A * 10/2000 Lin et al. .................. 438/627
6,492,257 B1 * 12/2002 Shields et al. ............. 438/622
6,794,298 B2 * 9/2004 Shields et al. ............. 438/710

FOREIGN PATENT DOCUMENTS

| JP | 10-209272 A | | 8/1998 |
| JP | 2000-208514 | * | 7/2000 |
| JP | 2003-218117 | * | 7/2003 |

OTHER PUBLICATIONS

IC Knowledge Glossary on internet—definition of the term titanium nitride (2000'-2004').*
Office Action dated Mar. 20, 2007 issued in corresponding Korean Application No. 10-2006-0020423.

* cited by examiner

*Primary Examiner*—George A. Goudreau
(74) *Attorney, Agent, or Firm*—Westerman, Hattori, Daniels & Adrian, LLP.

(57) ABSTRACT

A method for fabricating a semiconductor device with a borderless via/wiring structure includes the steps of performing borderless via etching using a resist mask to form a contact hole in an interlevel dielectric layer over a semiconductor substrate so as to expose two different metal materials of lower layer patterns in the contact hole; and performing plasma irradiation using an $H_2O$-containing gas prior to a wet process when removing the resist mask.

12 Claims, 10 Drawing Sheets

11: 1ST INTERLEVEL DIELECTRIC (D1)
12: 1ST METAL WIRING (M1)
13: 2ND INTERLEVEL DIELECTRIC (D2)
14: BARRIER METAL (V)
15: 1ST VIA CONTACT (METAL PLUG) (P)
16: 2ND METAL WIRING (M2)
17: 3RD INTERLEVEL DIELECTRIC (D3)
18: RESIST (R)

VIA ETCHING AND RESIST ASHING 1

METAL (W) DISAPPEARANCE AFTER WET PROCESS

VIA ETCHING AND RESIST ASHING 1

H₂O CONTAINED PLASMA IRRADIATION

DEPOSITION OF METAL LAYERS AND CMP

FORMATION OF 3ᴿᴰ METAL WIRING

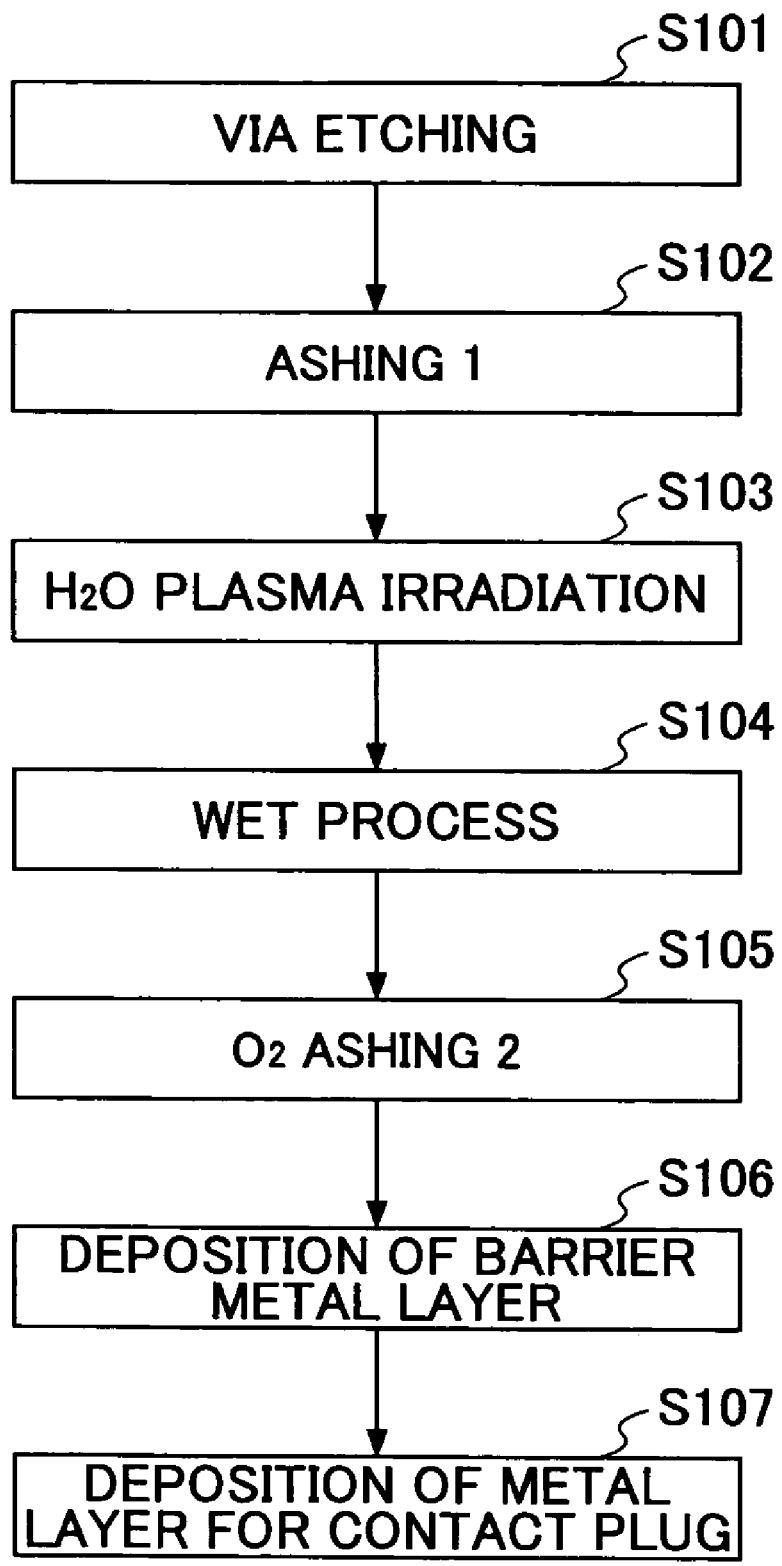

FIG.4A

| 1ST IRRADIATION | 2 Torr, 500 H$_2$O, 0 W, 280 °C, 40 sec |
|---|---|
| 2ND IRRADIATION | 2 Torr, 1500 O$_2$/100 H$_2$O/50C F$_4$, 1400 W, 280 °C, 70 sec |
| 3RD IRRADIATION | 2 Torr, 500 H$_2$O, 800 W, 280 °C, 40 sec |

FIG.4B

| 1ST IRRADIATION | 1 Torr, 900 H$_2$O, 1000 W, 275 °C, 90 sec |
|---|---|
| 2ND IRRADIATION | 1 Torr, 900 H$_2$O/4500 O$_2$, 1000 W, 275 °C, 60 sec |

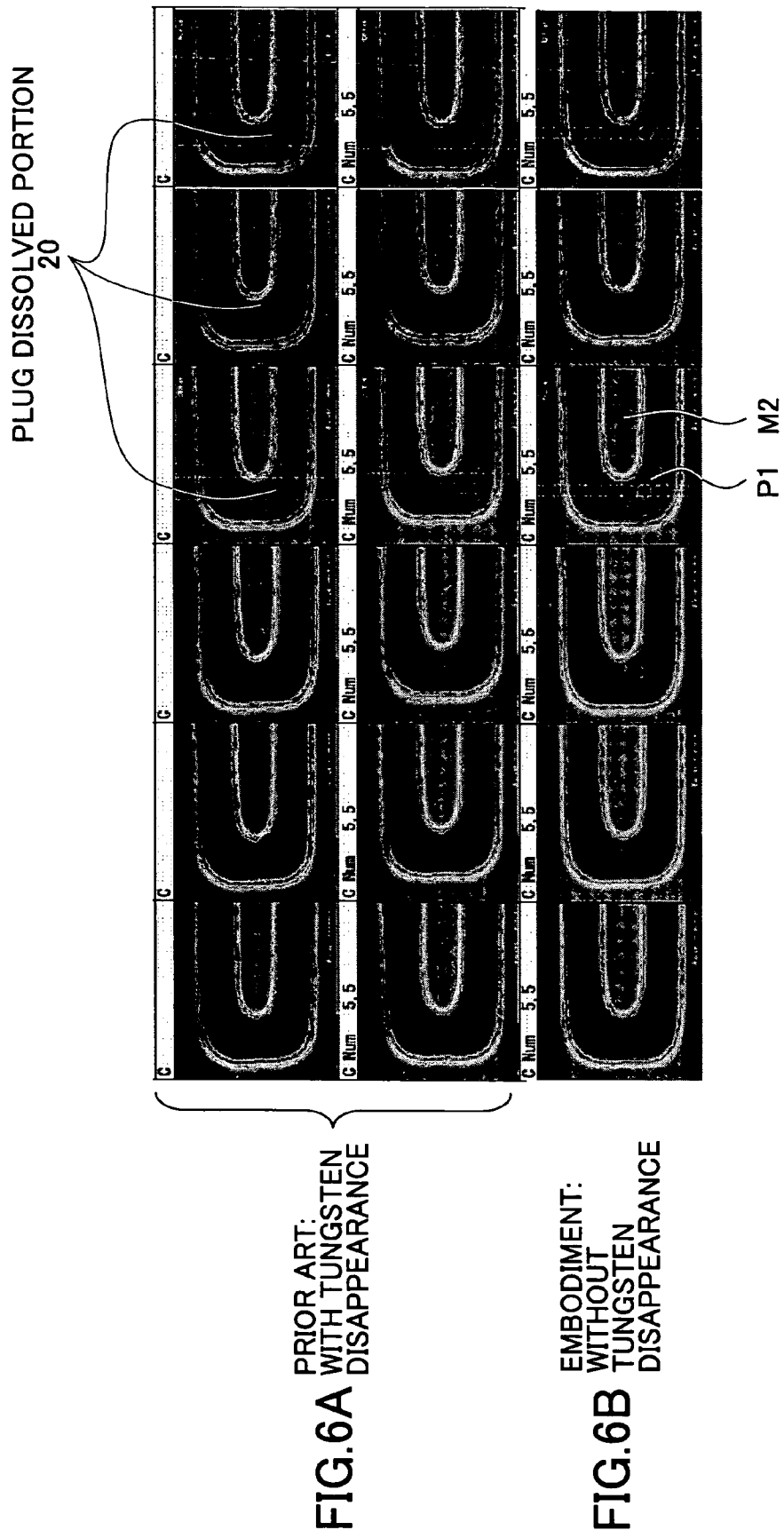

WITH TUNGSTEN DISAPPEARANCE

EMBODIMENT:
WITHOUT TUNGSTEN DISAPPEARANCE

SEMICONDUCTOR DEVICE FABRICATION METHOD

BACKGROUND OF THE INVENTION

1. Field of the Invention

The present invention generally relates to a semiconductor device fabrication method, and more particularly, to fabrication of a contact via plug after so-called borderless via etching during a fabrication process of a semiconductor device with multilevel interconnection.

2. Description of the Related Art

Along with miniaturization of semiconductor devices, borderless via/wiring structures are often employed in multilevel interconnections used to improve the degree of integration. A borderless via/wiring structure has an upper-layer or lower-layer wiring pattern that does not completely cover the contact surface of the metal contact plug connecting the upper and lower wiring patterns. In other words, the upper-layer wiring pattern or the lower-layer wiring pattern is laterally displaced along the substrate surface and only partially overlaps the contact surface of the metal plug. See, for example, Japanese Laid-open Patent Publication No. 2003-218117A. It can be said that because of with miniaturization of device structures, a borderless structure is inevitably produced due to mask misalignment or exposure misalignment within the margin.

FIG. 1A through FIG. 1C illustrate a conventional process for fabricating multilevel interconnections with a borderless via/wiring structure. In FIG. 1A, a first metal wiring (M1) 12 is located on a first interlevel dielectric layer (D1) 11 over a semiconductor substrate (not shown). The first metal wiring 12 is covered with a second interlevel dielectric layer (D2) 13, and a second metal wiring (M2) 16 is located over the second interlevel dielectric layer 13. A contact metal plug (P) 15 surrounded by a barrier metal 14 connects the first metal wiring 11 with the second metal wiring 16. The second metal wiring 16 does not completely cover, but partially overlaps the top surface of the metal plug 15. This structure is called a borderless via/wiring structure. The metal plug 15 and the second metal wiring 16 are covered with a third interlevel dielectric layer 17, and a resist mask (R) 18 defining a prescribed pattern is located over the third interlevel dielectric layer 17.

Then, as illustrated in FIG. 1B, a contact hole 19 is formed in the third interlevel dielectric layer 17 by etching so as to reach the second metal wiring 16. Because of the borderless via/wiring structure, the contact hole 19 further reaches the metal plug 15 with the second metal wiring 16 serving as a stopper. As a result, two different metals, e.g., aluminum (Al) of the second metal wiring 16 and tungsten (W) of the metal plug 15, are exposed in the contact hole 19.

After the contact hole 19 is formed, the resist mask 18 is removed by an ashing process. With the conventional method, plasma ashing is typically performed using oxygen O2 gas, or N2 added and/or CF4 added to oxygen gas, such as O2/N2 or O2/N2-H2/CF4. During the resist ashing, the top surface of the metal (tungsten) plug 15 revealed under the second metal wiring 16 is exposed to the ashing plasma in the contact hole 19. Consequently, electric charge is accumulated on the surface of the tungsten plug 15.

Then, the device is rinsed using an amine based solvent to remove the residual sediment, such as heavy metal materials, remaining after the ashing. This amine based wet process causes the charged surface of the tungsten plug 15 to be easily dissolved. As a result, a dissolved portion 20 (see FIG. 1C) is produced in the tungsten plug 15. Even after the contact hole 19 is filled with a metal material, the dissolved portion 20 remains as a void or a cavity, which prevents good electric contact between the upper and lower metal wirings 16 and 12. This means that the device quality is degraded.

SUMMARY OF THE INVENTION

To overcome the above-described problem, the present invention provides a semiconductor device fabrication method that achieves reliable electric contact even with a borderless via/wiring structure, and that can improve the reliability of the operations.

To realize this, plasma irradiation using H2O gas or an H2O-containing gas (referred to as "H2O irradiation") is performed prior to the wet rinsing process when removing the resist mask used to form the contact hole.

In one aspect of the invention, a method for fabricating a semiconductor device with a borderless via/wiring structure is provided. The method comprises the steps of:

(a) performing borderless via etching using a resist mask to form a contact hole in an interlevel dielectric layer over a semiconductor substrate so as to expose two different metal materials of lower layer patterns in the contact hole; and (b) performing plasma irradiation using an H2O-containing gas prior to a wet process when removing the resist mask.

In another aspect of the invention, a semiconductor device fabrication method comprises the steps of:

(a) forming a first contact plug connected to a lower-layer metal wiring over a semiconductor substrate;

(b) forming an upper-layer metal wiring that overlaps the top face of the first contact plug;

(c) depositing an interlevel dielectric layer over the first contact plug and the upper-layer metal wiring;

(d) forming a contact hole in the interlevel dielectric layer so as to reach the overlapped portion to expose a part of the upper-layer metal wiring and a part of the first contact plug in the contact hole;

(e) performing plasma irradiation using an H2O-containing gas;

(f) removing a reaction product by a wet process using an amine based organic solvent; and (g) filling the contact hole with a metal material to form a second contact plug.

With these methods, electric charge accumulated on the plug surface exposed in the borderless via/wiring structure can be reduced by the H2O plasma irradiation performed prior to the wet process to remove the resist mask.

Consequently, dissolving of the metal plug can be prevented, and reliable electric contact can be guaranteed.

BRIEF DESCRIPTION OF THE DRAWINGS

Other objects, features, and advantages of the present invention will become more apparent from the following detailed description when read in conjunction with the accompanying drawings, in which:

FIG. 3 is a flowchart of the borderless-via contact fabrication process according to an embodiment of the invention;

FIG. 4A and FIG. 4B illustrate detailed conditions of H2O-containing plasma irradiation;

FIG. 6 is a surface SEM image showing the tungsten dissolution preventing effect of H2O plasma irradiation according to the embodiment of the invention.

DETAILED DESCRIPTION OF THE PREFERRED EMBODIMENTS

The preferred embodiments of the present invention are described below with reference to the attached drawings.

Figure 1A:
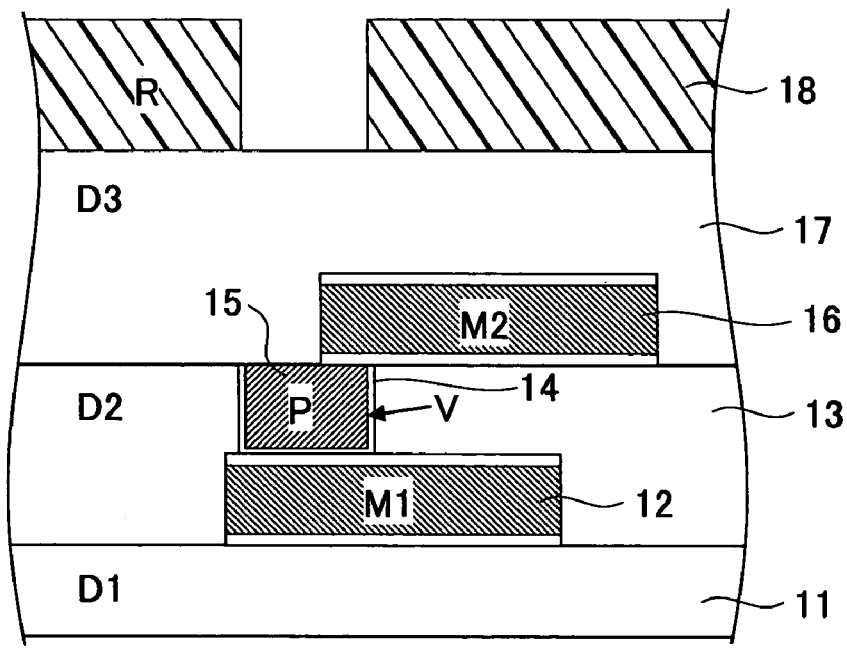
FIG. 1A through FIG. 1C are schematic diagrams used to explain a problem in a conventional method for fabricating a metal plug by borderless via etching.
Figure 1B:
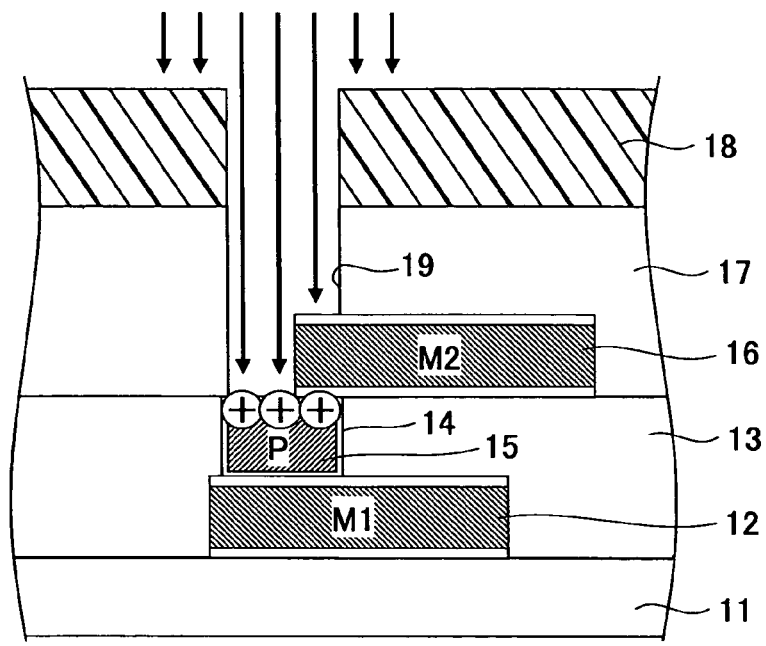
Figure 1C:
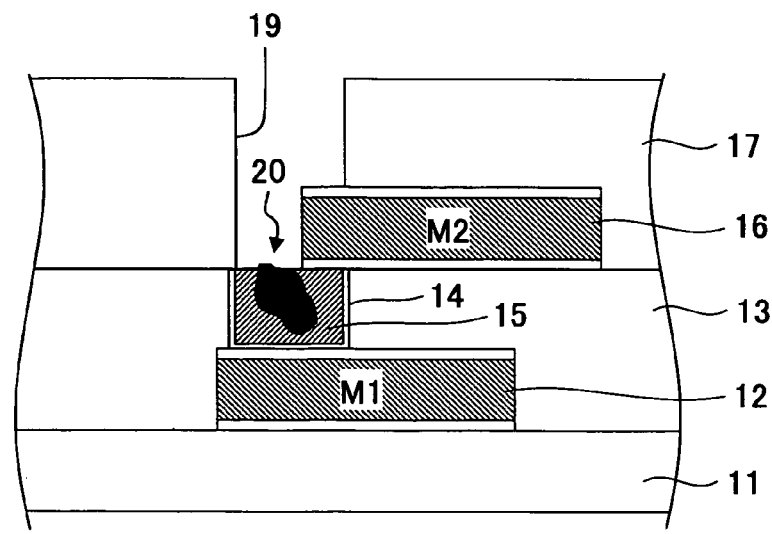
Figure 2A:
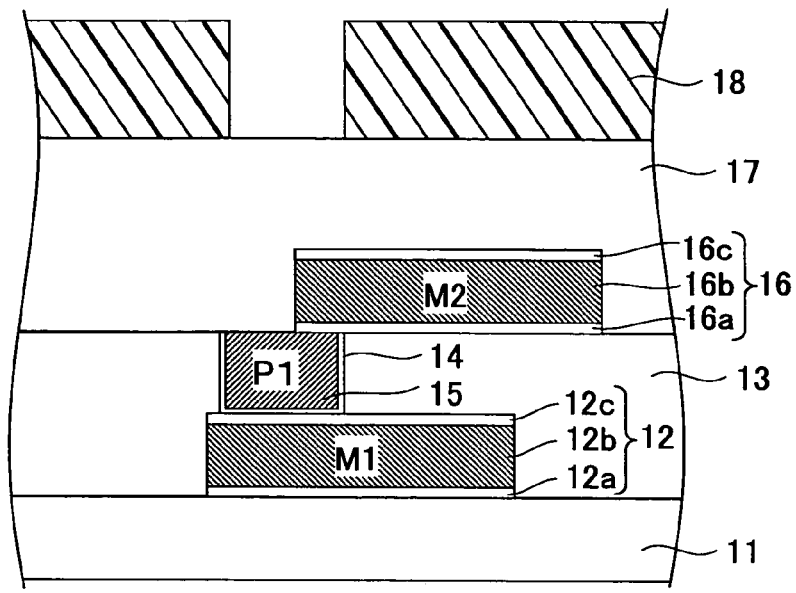
FIG. 2A through FIG. 2E illustrate in cross-sectional views a semiconductor device fabrication process according to an embodiment of the invention.

FIG. 2A through FIG. 2E illustrate a semiconductor device fabrication process according to an embodiment of the invention. First, as illustrated in FIG. 2A, TiN film 12a, Al film (or Al—Cu film) 12b, and TiN film 12c are successively deposited on the first interlevel dielectric layer 11 formed over a semiconductor substrate (not shown), and patterned into a prescribed shape to define a first metal wiring (M1) 12. The first metal wiring 12 is electrically connected to an active or passive device (not shown) formed on the semiconductor substrate.

A second interlevel dielectric layer 13 is deposited over the first metal wiring 12, and chemical mechanical polishing (CMP) is performed to obtain a flat surface. A contact hole (not shown) is formed in the second interlevel dielectric layer 13 so as to reach the first metal wiring metal 12. The contact hole is coated with a barrier metal film 14, and filled with a metal material, such as Tungsten (W), to form a first metal (W) plug 15 by a CMP or etch back process.

Then, a TiN film 16a, an Al (or Al—Cu) film 16b, and a TiN film 16c are successively formed over the second interlevel dielectric layer 13, and these films are patterned into a prescribed shape to define a second metal wiring (M2) 16. The second metal wiring 16 overlaps the first metal (W) plug 15 to cover only a part of the plug surface. This structure is a so-called borderless via/wiring structure. A third interlevel dielectric layer 17 is formed over the second metal wiring 16 and the second interlevel dielectric layer 13, and the surface is flattened. A resist mask 18 with a prescribed aperture pattern is formed on the third interlevel dielectric layer 17.

Figure 2B:
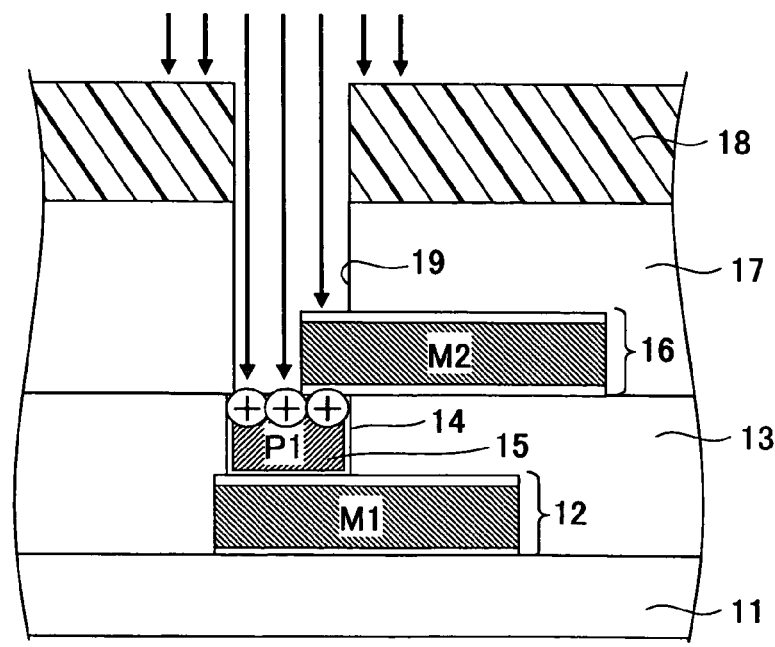

Then, as illustrated in FIG. 2B, a contact hole 19 is formed in the third interlevel dielectric layer 17 using the resist mask 18 so as to reach the second metal wiring (M2) 16 and the first metal plug 15 located under the second metal wiring 16. The second metal wiring 16 serves as a stopper film. By applying anisotropic etching to the third interlevel dielectric layer 17, a contact hole 19 reaching the first metal plug 15 can be formed.

After the contact hole 19 is formed, at least a portion of the resist mask 18 is removed by an ordinary ashing process. During this ashing process (Ashing 1), electric charge is accumulated on the surface of the first metal plug 15 partially exposed in the contact hole 19.

Figure 2C:
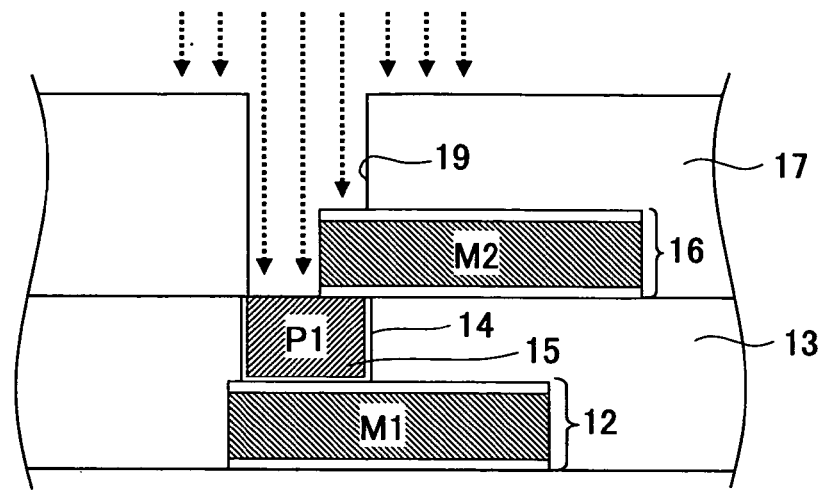

Then, as illustrated in FIG. 2C, plasma irradiation is performed using a gas containing H2O. This H2O plasma irradiation removes the residual resist mask 18, and sufficiently removes the electric charge accumulated on the exposed surface of the tungsten plug 15. The details of the H2O plasma irradiation are described below. After the H2O plasma irradiation, the wafer is rinsed in a wet process using an amine based organic solvent to remove reaction products. Because the electric charge is sufficiently removed from the surface of the first metal plug 15, dissolution of tungsten can be prevented even in the wet process using the amine based organic solvent. After the wet process, a second ashing (Ashing 2) may be performed using an O2-containing gas as necessary.

Figure 2D:
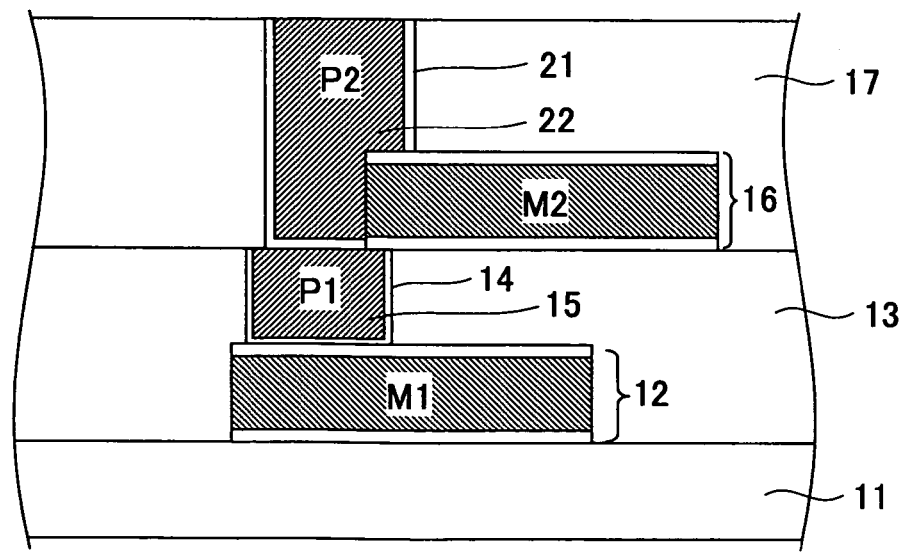

Then, as illustrated in FIG. 2D, the contact hole 19 is coated with a barrier metal film 21, and filled with a metal film, such as a tungsten film, to form a second metal plug 22 by a CMP or etch back process. The second metal plug 22 is connected to the second metal wiring (M2) 16 and the first metal plug 15. The positional relationship between the second metal plug 22 and the second metal wiring (M2) is borderless.

Figure 2E:
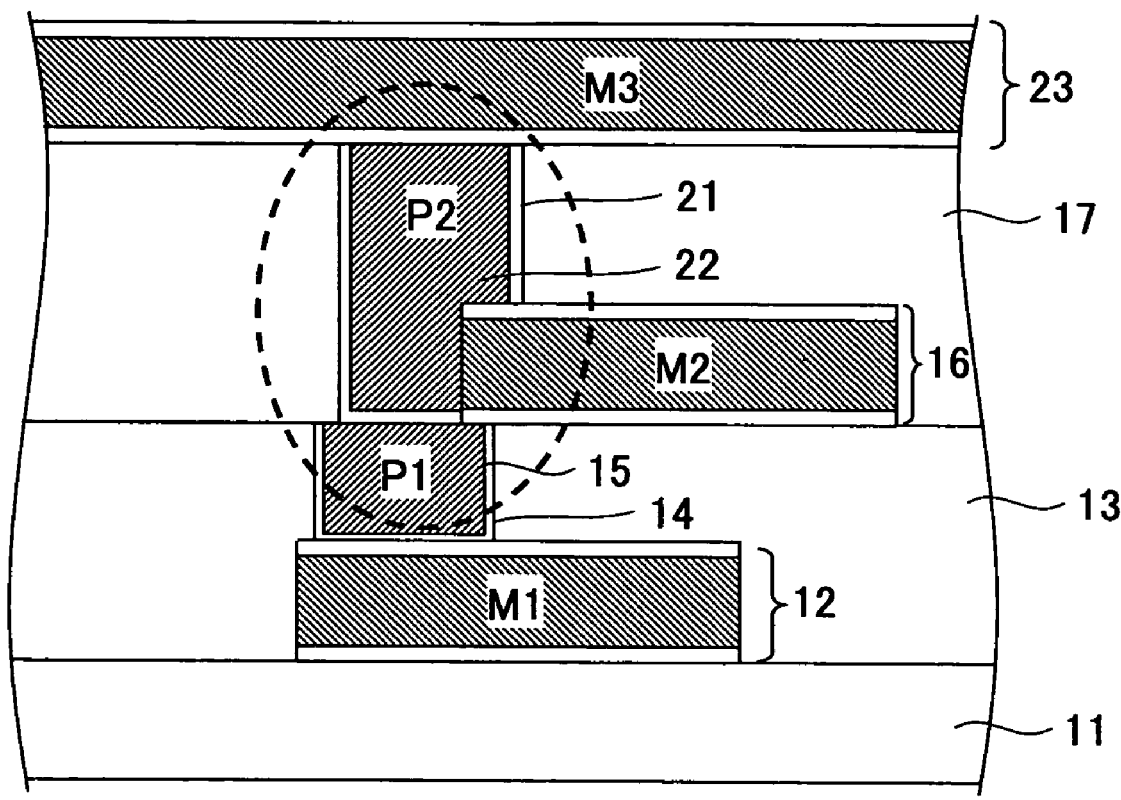

Then, as illustrated in FIG. 2E, a third metal wiring (for example, a TiN/Al—Cu/TiN wiring) 23 is formed on the third interlevel dielectric layer 17. Although not depicted in FIG. 2E, additional upper layer metal wiring and metal plug are formed as necessary to complete a semiconductor device with a borderless via/wiring structure indicated by the circle of the dashed broken line. This semiconductor device has an improved electric characteristic and satisfactory reliability with little damage due to dissolution of the lower layer metal plug 15.

FIG. 3 is a flowchart of a part of the semiconductor device fabrication process, starting from via etching for forming the contact hole 19 through formation of the metal plug (FIG. 2D).

After the contact hole 19 is formed by photolithography and via etching (S101), the wafer is placed in a downflow plasma asher to perform ordinary ashing (first ashing) without using H2O to remove the resist mask 18 used to form the contact hole 19 (S102). The first ashing is performed for 90 seconds at 250° C. and power of 1100 W, by supplying O2 gas and N2 gas at rates of 3550 sccm and 140 sccm, respectively.

Then, the wafer is moved into a metal etcher ashing chamber to perform plasma irradiation using an H2O-containing gas (S103). After the H2O irradiation, the wafer is rinsed using an amine-based organic solvent to remove reaction products (S104). Then, second ashing is performed using an O2-containing gas (S105). A barrier metal film 21 is formed in the contact hole 19 (S106), and a metal film material is deposited so as to fill the contact hole 19 to form a contact plug 22 (S107).

FIG. 4A and FIG. 4B are tables showing detailed conditions of the H2O plasma irradiation step S103 shown in FIG. 3. In the example shown in FIG. 4A, three sets of H2O irradiation are performed.

The first irradiation is performed for 40 seconds at 280° C. and power of 0 W under pressure of 2 Torr, while supplying H2O gas at 500 sccm.

The second irradiation is performed for 70 seconds at 280° C. and power of 1400 W under pressure of 2 Torr, supplying O2, H2O, and CF4 at 500 sccm, 100 sccm, and 50 sccm, respectively.

The third irradiation is performed for 40 seconds at 280° C. and power of 800 W under pressure of 2 Torr, while supplying H2O gas at 500 Sccm.

By performing H2O irradiation using H2O gas or an H2O-containing gas prior to the wet process, electric charge accumulated on the first metal plug 15 can be sufficiently reduced. The first and third H2O irradiations also have a corrosion preventing effect for preventing aluminum (Al) of the second metal wiring (M2) 16 from corroding.

In the example shown in FIG. 4B, two sets of H2O irradiation are performed. The first irradiation is performed for 90 seconds at 275° C. and power of 1000 W under pressure of 1 Torr by supplying H2O at 900 sccm. The second irradiation is performed for 60 seconds at 275° C. and power of 1000 W under pressure of 1 Torr by supplying H2O and O2 at 900 sccm and 4500 sccm, respectively. The sequence of the first and second irradiations may be switched. Alternatively, only the second irradiation may be performed. In either case, an electric charge reducing effect can be sufficiently achieved.

Figure 5:
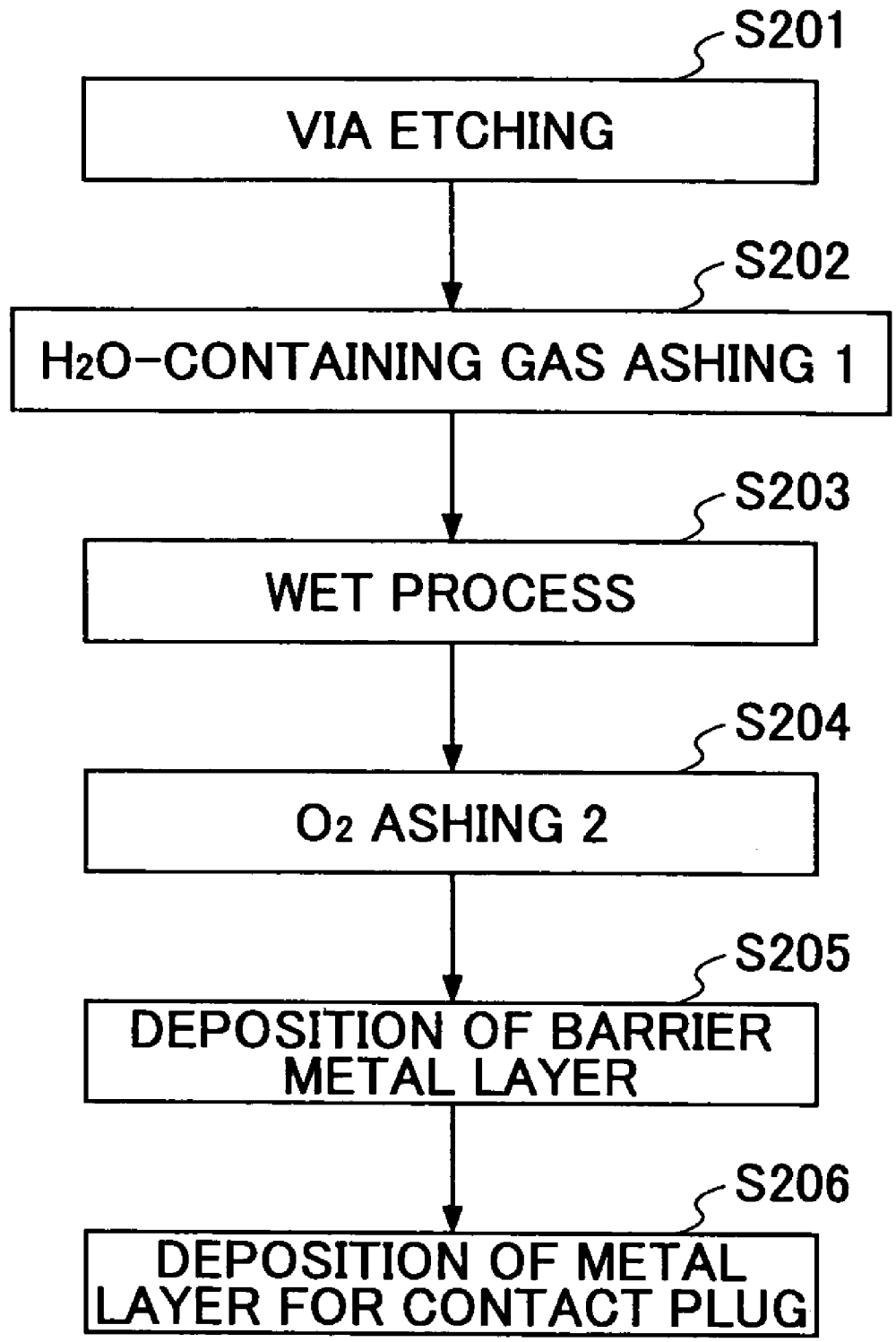
FIG. 5 is a flowchart of a modification of the borderless via contact fabrication process.

FIG. 5 is a flowchart showing a modification of the fabrication process of a metal plug with a borderless via/wiring structure shown in FIG. 3. After a contact hole 19 is formed by photolithography and via etching (S201), a first ashing (Ashing 1) is performed making use of H2O plasma irradiation according to the embodiment (S202) under the conditions shown in FIG. 4B. With this first ashing, the resist mask 18 can be removed, while preventing electric charge from accumulating on the exposed surface of the metal plug 15. After the H2O irradiation, the wafer is rinsed in a wet process using an amine based organic solvent to remove reaction products (S203). Then, a second ashing using an O2-containing gas is performed as necessary (S204). Then, a barrier metal film 21 is formed in the contact hole 19, and a metal film material is deposited so as to fill the contact hole 19 to form a metal plug 22 (S206).

This method can also reduce the electric charge to be accumulated on the exposed surface of the first metal plug 15 during the formation of the second metal plug 22 connected to the second metal wiring (M2) 16 and the lower metal plug 15 in a borderless positional relationship. Consequently, dissolving of the metal material of the contact plug 15 can be prevented in the subsequent wet process.

Figures 7A, 7B:
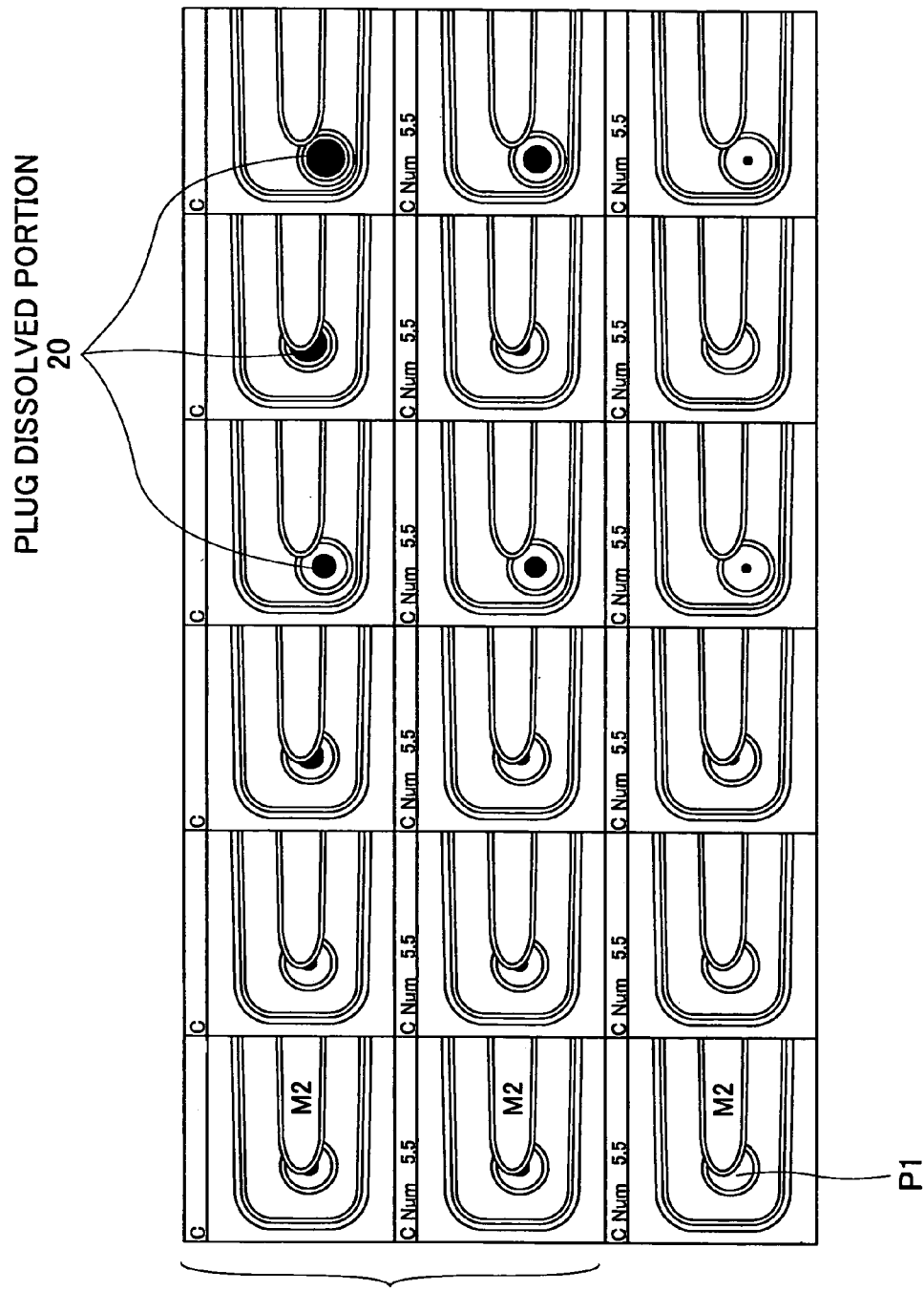
FIG. 7 is a schematic diagram depicting the surface SEM image shown in FIG. 6.

FIG. 6B is a surface SEM image showing the tungsten dissolution preventing effect achieved by the H2O irradiation according to the embodiment, and FIG. 7B is a schematic diagram illustrating the SEM image shown in FIG. 6B. As a comparison, FIG. 6A and FIG. 7A shows SEM observation results according to a conventional method (in which the contact hole is filled with a metal material after ordinary ashing without using H2O gas and the subsequent wet process).

In FIG. 6A and FIG. 6B, the overlapping amount of the second metal wiring (M2) 16 with respect to the lower metal plug (P1) 15 is varied, and the tungsten dissolving state is observed by a scanning electron microscope with the contact hole unfilled. The dark shadow observed in the round-shaped plug surface (P1) 15 partially exposed under the U-shaped second metal wiring (M2) 16 extending in the left-to-right direction is tungsten dissolved portion 20. With the conventional method shown in FIG. 6A, tungsten dissolution is observed in the metal plug P1 regardless of the overlapping amount between the metal plug P1 and the second metal wiring M2, and the plug dissolution becomes especially conspicuous when the misalignment between the plug P1 and the second metal wiring M2 becomes large.

In contrast, when the wet process is performed after H2O irradiation after or during the ashing according to the embodiment, there is little dissolution of tungsten plug (P1) observed in the surface SEM image, as illustrated in FIG. 6B. Even if the misalignment between the metal plug (P1) and the second metal wiring (M2) become the maximum, tungsten dissolution can be reduced to the minimum.

In this manner, satisfactory electrical contact can be maintained even if a borderless via/wiring structure is employed, and operational reliability of the semiconductor device is improved.

This patent application is based on and claims the benefit of the earlier filing dates of Japanese Patent Application No. 2005-308621 filed Oct. 24, 2005, the entire contents of which are incorporated herein by reference.

What is claimed is:

1. A semiconductor device fabrication method comprising the steps of:

forming a first contact plug connected to a lower-layer metal wiring over a semiconductor substrate;

forming an upper-layer metal wiring that overlaps the top face of the first contact plug;

depositing an interlevel dielectric layer over the first contact plug and the upper-layer metal wiring;

forming a contact hole in the interlevel dielectric layer so as to reach the overlapped portion to expose a part of the upper-layer metal wiring and a part of the first contact plug in the contact hole;

performing plasma irradiation using an H2O-containing gas;

removing a reaction product by a wet process using an amine based organic solvent; and filling the contact hole with a metal material to form a second contact plug.

2. The semiconductor device fabrication method of claim 1, further comprising the steps of:

forming a resist mask having an aperture pattern corresponding to the contact hole over the interlevel dielectric layer; and performing ashing using a gas that does not contain H2O after the formation of the contact hole and before the H2O-containing plasma irradiation.

3. The semiconductor device fabrication method of claim 1, further comprising the steps of:

forming a resist mask having an aperture pattern corresponding to the contact hole over the interlevel dielectric layer;

wherein the resist mask is removed by the plasma irradiation using the H2O-containing gas.

4. The semiconductor device fabrication method of claim 2, further comprising the step of:

performing a second ashing using an O2-containing gas after the wet process.

5. The semiconductor device fabrication method of claim 3, further comprising the step of:

performing a second ashing using an O2-containing gas after the wet process.

6. The semiconductor device fabrication method of claim 1, wherein the plasma irradiation using the H2O-containing gas includes a first irradiation using a mixed gas containing H2O and O2.

7. The semiconductor device fabrication method of claim 6, wherein the plasma irradiation using the H2O-containing gas includes a second irradiation using H2O gas.

8. The semiconductor device fabrication method of claim 6, wherein the first irradiation includes using a mixed gas of H2O, O2, and CF4.

9. The semiconductor device fabrication method of claim 1, wherein the first contact plug and the upper layer metal wiring are made of different metal materials.

10. The semiconductor device fabrication method of claim 1, wherein electric charge accumulated on the first contact plug exposed in the contact hole is reduced by the plasma irradiation using the H2O-containing gas.

11. The semiconductor device fabrication method of claim 1, further comprising the step of:

connecting the lower-layer metal wiring to an active or passive element formed on the semiconductor device.

12. The semiconductor device fabrication method of claim 1, wherein the upper-layer metal wiring and the second contact plug are in a borderless positional relationship.

* * * * *